United States Patent
Liu et al.

(10) Patent No.: US 9,293,221 B1
(45) Date of Patent: Mar. 22, 2016

(54) THREE TERMINAL FUSE WITH FINFET (71) Applicant: International Business Machines Corporation, Armonk, NY (US)

(72) Inventors: Derrick Liu, Albany, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/632,017

(22) Filed: Feb. 26, 2015

(51) Int. Cl.
G11C 17/00 (2006.01)
G11C 17/18 (2006.01)
G11C 17/16 (2006.01)

(52) U.S. Cl.
CPC ............... G11C 17/18 (2013.01); G11C 17/16 (2013.01)

(58) Field of Classification Search
CPC ........................................................ G11C 17/00
USPC ........................................................ 365/94–128
See application file for complete search history.

(56) References Cited

U.S. PATENT DOCUMENTS

| | | | |
|---|---|---|---|
| 6,775,171 B2* | 8/2004 | Novosel | G11C 17/16 257/E23.147 |
| 6,775,197 B2* | 8/2004 | Novosel | G11C 17/16 257/E23.147 |
| 6,816,427 B2* | 11/2004 | Novosel | G11C 17/16 365/225.7 |
| 7,067,359 B2 | 6/2006 | Wu | |
| 7,087,499 B2 | 8/2006 | Rankin et al. | |
| 7,417,897 B2* | 8/2008 | Chen | G11C 17/16 35/185.18 |
| 7,471,540 B2* | 12/2008 | Luan | G11C 11/404 257/E27.081 |
| 7,623,368 B2* | 11/2009 | Luan | G11C 11/404 257/530 |
| 7,960,760 B2 | 6/2011 | Marshall | |
| 8,030,736 B2 | 10/2011 | Booth, Jr. et al. | |
| 8,053,809 B2 | 11/2011 | Cheng et al. | |
| 8,134,859 B1* | 3/2012 | Novosel | G11C 17/165 365/148 |
| 8,400,813 B2 | 3/2013 | Lee | |
| 8,471,296 B2 | 6/2013 | Cheng et al. | |
| 2004/0100848 A1* | 5/2004 | Novosel | G11C 17/16 365/225 |
| 2004/0100849 A1* | 5/2004 | Novosel | G11C 17/16 365/225.7 |
| 2004/0100850 A1* | 5/2004 | Novosel | G11C 17/16 365/225.7 |
| 2007/0247902 A1* | 10/2007 | Chen | G11C 17/16 365/185.01 |
| 2008/0175060 A1* | 7/2008 | Liu | G11C 11/404 365/185.18 |
| 2009/0085127 A1* | 4/2009 | Liu | G11C 11/404 257/393 |
| 2010/0244144 A1 | 9/2010 | Hsueh et al. | |
| 2013/0105895 A1 | 5/2013 | Liang et al. | |
| 2013/0148409 A1 | 6/2013 | Chung | |

* cited by examiner

Primary Examiner — Harry W Byrne
(74) Attorney, Agent, or Firm — Cantor Colburn LLP; Vazken Alexanian (57) ABSTRACT

A technique is provided for programming a transistor having a source, a drain, a gate, and a channel region between the source and the drain. The gate is above dielectric above the channel region. A gate voltage is about equal to or greater than a breakdown voltage of the gate dielectric in order to break down the gate dielectric into a breakdown state. Current flows between the source and the drain as a result of breaking down the gate dielectric. In response to the transistor being programmed, the current flowing between the source and the drain is not based on the gate voltage at the gate.

1 Claim, 7 Drawing Sheets

THREE TERMINAL FUSE WITH FINFET

BACKGROUND

The present disclosure relates generally to electrical fuse technology, and more specifically to a fin field effect transistor (FinFET) as a three terminal electrical fuse.

Electrically programmable semiconductor fuses, or electrical fuses (efuse) in short, have been used in semiconductor circuits to provide alterations in the functionality of the circuitry. Typical examples of applications of electrical fuses include: providing redundancy to enable repairs of imperfect chips, storage of secure and permanent information, selection of a particular configuration for chip operation, tuning analog circuit components, optimizing overall circuit performance, and/or replacing defective circuit elements with redundant circuit elements.

Electrical fuses are programmed by the physical alteration of the structure of the electrical fuses. The most commonly used structure of electrical fuses employs a vertical stack comprising a semiconducting material and a conducting material. While the most common material for the vertical stack is polysilicon and silicide, other semiconducting materials and other conducting materials may be utilized if similar electromigration properties can be found in the combined stack of the two materials. This stack is patterned such that a narrow, long piece of material, called "fuselink" or "fuse neck," is adjoined by two large plates, called "cathode" and "anode" respectively, depending on the polarity of electrical bias applied to the electrical fuse during the programming. Electrical current of relatively high density flows through the fuselink when a sufficiently high voltage bias is applied across the cathode and the anode. The programming current may be high enough to cause the electrical fuses to rupture by a sudden increase in temperature in the physical structure of the electrical fuses. This type of programming is commonly referred to as "rupture mode programming." Alternatively, the level of the programming current may be moderated to cause a controlled electromigration of the material inside the electrical fuse structure. This alternative mode of programming is commonly referred to as "electromigration mode programming." Both types of programming methods raise the resistance of the programmed fuse compared to that of intact fuses.

By measuring the resistance of electrical fuses, it can be determined whether the electrical fuse has been programmed or is left intact. While it may not be necessary to measure the exact value of the fuse resistance to determine the state of the fuse, it is generally performed to determine whether the fuse resistance has been raised by a significant amount above the detection limit of the sensing circuitry. Typically, this is done by setting the resistance for a reference resistor at a value about 3-10 times that of an intact electrical fuse and comparing the resistance of the fuse with that of the reference resistor. A difference between the resistance of the reference resistor and the resistance of an intact fuse is often necessary to ensure margin in the functionality of the sensing circuitry under adverse operating conditions of the chip.

SUMMARY

Embodiments include a method for programming a transistor having a source, a drain, a gate, and a channel region between the source and the drain. A gate dielectric is above the channel region. A gate voltage is applied about equal to or greater than a breakdown voltage of the gate dielectric in order to break down the gate dielectric into a breakdown state. Current is caused to flow between the source and the drain as a result of breaking down the gate dielectric. In response to the transistor being programmed, the current flowing between the source and the drain is not based on the gate voltage at the gate.

Embodiments include a method of programming a plurality of transistors. The plurality of transistors is configured in an arrangement, in which each of the plurality of transistors having a source, a drain, and a gate. A channel region is between the source and the drain, and a gate dielectric is above the channel region. Certain ones of the plurality of transistors are programmed by applying a gate voltage about equal to or greater than a breakdown voltage of the gate dielectric in order to break down the gate dielectric into a breakdown state. Current is caused to flow between the source and the drain as a result of breaking down the gate dielectric. In response to the certain ones of the plurality of transistors being programmed, the current flowing between the source and the drain of the certain ones of the plurality of transistors is not based on the gate voltage at the gate.

Embodiments include a programmed circuit. A plurality of transistors in an arrangement, each of the plurality of transistors having a source, a drain, and a gate. A channel region is between the source and the drain, and a gate dielectric is at least one of above the channel region and wrapped around the channel region. A programmed set of the plurality of transistors have been programmed, and the programmed set of the plurality of transistors has the gate dielectric that is broken down in response to applying a gate voltage about equal to or greater than a breakdown voltage of the gate dielectric. An unprogrammed set of the plurality of transistors has not been programmed. The unprogrammed set of the plurality of transistors has the gate dielectric that has not been broken down.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present disclosure is particularly pointed out and distinctly claimed in the claims at the conclusion of the specification. The foregoing and other features and advantages are apparent from the following detailed description taken in conjunction with the accompanying drawings in which:

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

Efuses have traditionally been two terminal devices which rely on electromigration of silicide for programming. As technologies continue to scale, the process flow becomes increasingly complex, requiring additional mask adders. For example, traditional planar polysilicon gates are no longer present to build efuses. This has resulted in new methods such as using oxide breakdown of capacitors or using additional masks to build efuses.

According to embodiments, a finFET, e.g., on silicon on insulator (SOI), can be utilized as a "fuse-like" device. This allows for detection of a programmed state and before-programmed state without any additional mask adders.

Figure 1:
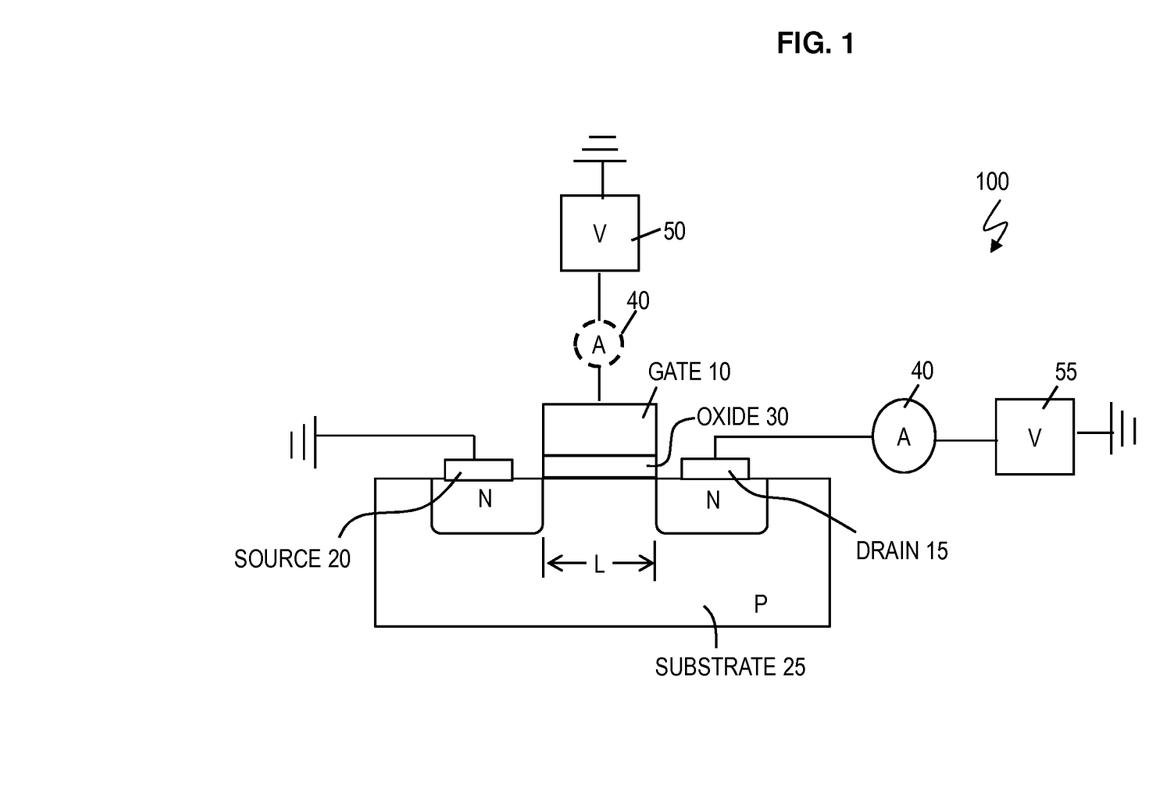
FIG. 1 illustrates a cross-sectional view of an unprogrammed transistor according to an embodiment.

FIG. 1 illustrates a cross-sectional view of an unprogrammed transistor 100 according to an embodiment. The transistor 100 has two n-type wells in the substrate 25. A drain terminal 15 is connected to one n-type well, and a source terminal 20 is connected to the other n-type well. A gate oxide 30 is on top of the substrate 25 between the two n-type wells. A gate terminal 10 is connected on top of the gate oxide 30, and the gate 10 is connected to a voltage source 50. The source 20 may be connected to ground and the drain 15 may be connected to a voltage source 55 via an ammeter 40. The drain, source, and gate terminals may be metal contacts, metal alloys, and/or polysilicon. In FIG. 1, the transistor 100 is in the before-programmed state (i.e., not programmed). It is assumed that the voltage source 55 applies a drain voltage (e.g., x amount of volts, such as 5 volts) at the drain 15, such that the drain voltage is not zero. When the voltage source 50 applies no gate voltage (i.e., gate voltage equals zero) to the gate 10 (and the drain voltage is applied), the transistor 100 is turned off and no current flows from the drain 15 to the source 20 (as measured by the ammeter 40) in an ideal transistor. When the gate voltage of voltage source 50 is turned on to a gate voltage threshold (Vt) (and the drain voltage is applied), current flows from the drain 15 to the source 20 as understood by one skilled in the art. Given that the drain voltage is on (i.e., applied by the voltage source 55), the current flow between the drain and source is controlled by the gate voltage applied to the gate 10.

Figure 2:
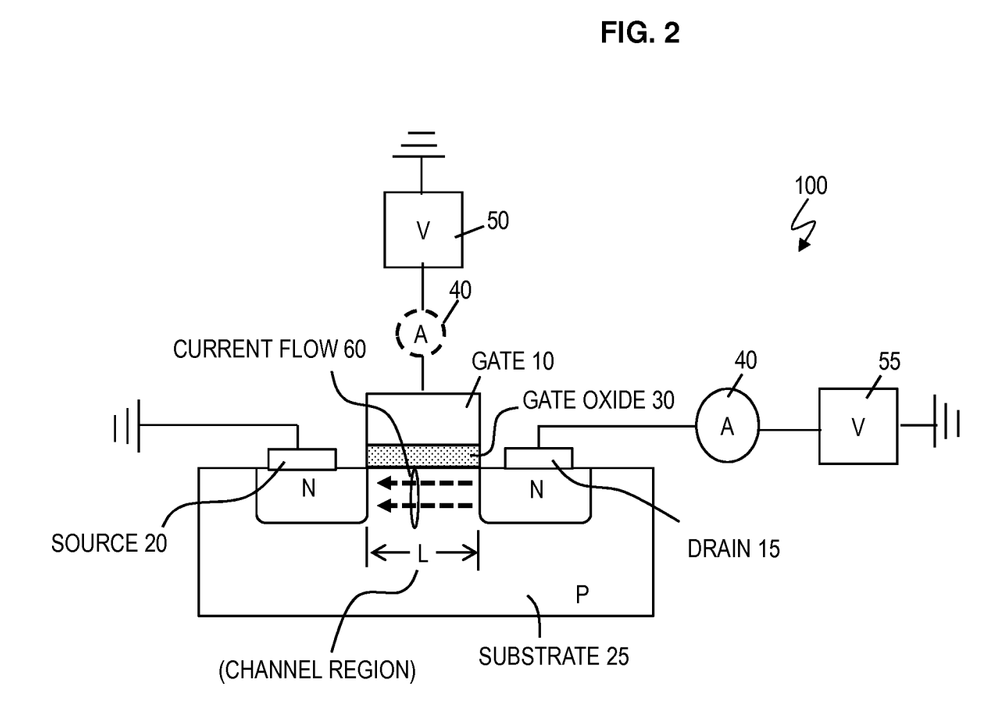
FIG. 2 illustrates a cross-sectional view of the transistor programmed according to an embodiment.

FIG. 2 illustrates a cross-sectional view of the transistor 100 programmed (i.e., in a programmed state) according to an embodiment. In FIG. 2, the voltage source 50 is applied with a gate voltage having a magnitude equal to and/or greater than breakdown voltage of the gate oxide 30, which leaves the gate oxide in a breakdown state. Accordingly, the gate oxide 30 breaks down (i.e., is blown like a fuse) and the breakdown state of the gate oxide 30 is represented with the dotted pattern. The electric field generated by the applying the breakdown voltage contributes to the gate oxide break down. It is noted that although gate oxide is utilized for explanation purposes, the gate oxide 30 is not limited to an oxide material but may be any dielectric typically utilized in transistors. The breakdown voltage of a dielectric (such as an oxide) is the minimum voltage that causes a portion of the dielectric to become electrically conductive. Breakdown voltage is a characteristic of the dielectric that defines the maximum voltage difference that can be applied across the material before the dielectric collapses and conducts. This usually creates a weakened path within the material by creating permanent molecular or physical changes by the sudden current/voltage.

The voltage source 50 may incorporate a charge pump to breakdown the gate oxide 30. Now that the gate oxide is blown, the gate voltage at the gate 10 can no longer control the current flow 60 from the drain 15 to the source 20. Accordingly, assume that the drain voltage (e.g., 5 volts) is applied to the drain 15 and the gate voltage is 0 volts at the gate 10 (i.e., the voltage source 50 is turned off), the current flow continues unchanged even though no gate voltage is applied. That is, even when no gate voltage is applied (i.e., 0 volts), there is a large shift in the resistance between the programmed state (i.e., the breakdown state in which the gate oxide is blown) and the before programmed state (i.e., the gate oxide is not blown). The programmed state of the transistor 100 has a lower resistance between the source 20 and drain 15 such that electrical current 60 flows, even when no gate voltage is applied. Accordingly, the transistor 100 is programmed.

The transistor 100 can be confirmed as programmed by sweeping the gate voltage values (of the voltage source 50) while the drain voltage is on, and then measuring the ammeter 40 to recognize that there is no (appreciable) change in the current flow 60. This is because the gate voltage no longer controls the current flow 60 in FIG. 2.

Note that the current 60 caused by the programmed state is not the leakage current in transistors. Leakage current, also called subthreshold current, is when carriers leak between source and drain terminals of a transistor as understood by one skilled in the art. The flow of current 60 (caused by the programming) is 2, 3, 4, and/or 5 orders of magnitude greater than the leakage current, e.g., $10^2$, $10^3$, $10^4$, and/or $10^5$ times greater than the leakage current. Accordingly, the flow of current 60 caused by programming the transistor 100 (300 in FIG. 3) is not the leakage current in a transistor.

Figure 3:
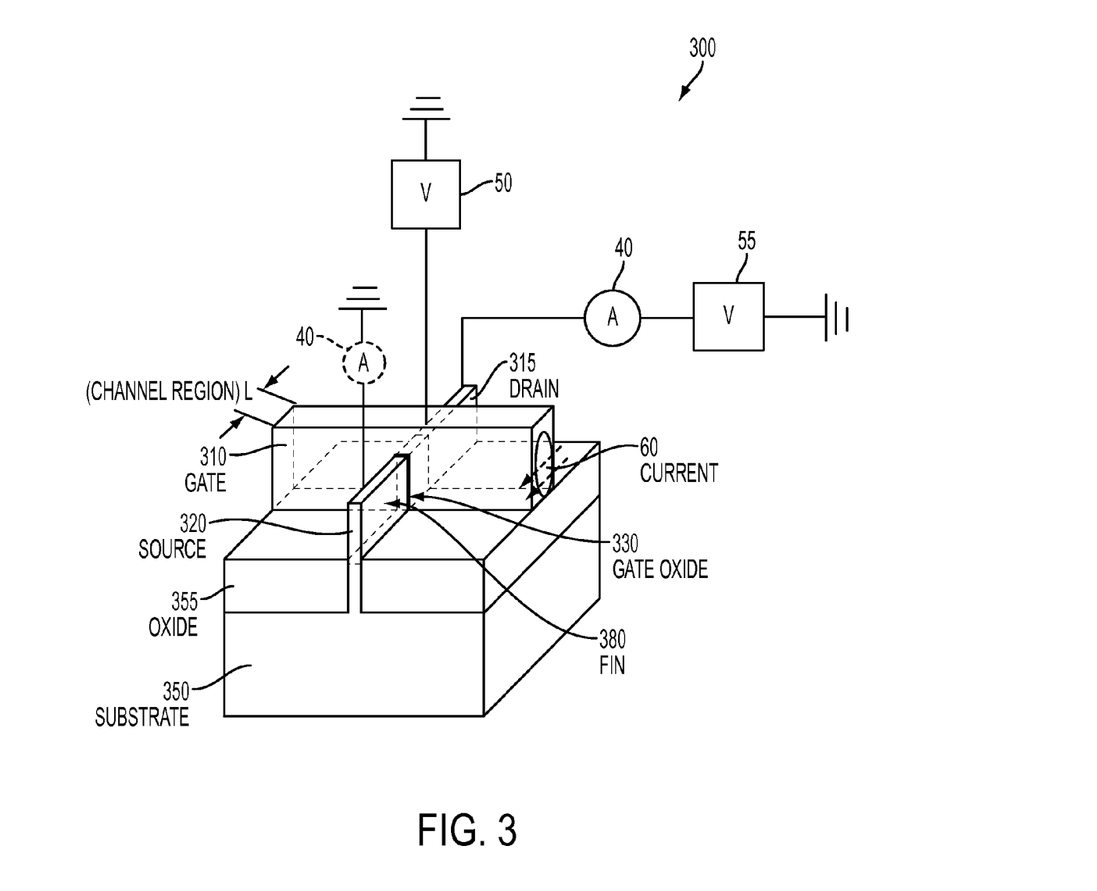
FIG. 3 illustrates an example of a finFET (fin field effect transistor) device that is programmed according to an embodiment.

As another example of programming a transistor, FIG. 3 illustrates an example of a finFET (fin field effect transistor) device 300 that is programmed according to an embodiment. The finFET device 300 has a fin 380 formed on a substrate 350. A gate oxide 330 may be formed on sides of the fin 380. The fin 310 is utilized to form the source 320 and drain 315 (on opposite ends), effectively providing more volume than a planar transistor for the same area. A gate electrode 310 wraps around the fin 380, providing better control of the channel and allowing very little current to leak (i.e., leakage current) through the body when the device is in the "off" state. This, in turn, results in better performance and power as compared to a planar transistor.

When the voltage source 50 applies 0 volts to the gate 310 and when the voltage source 55 applies voltage to the drain 15, no current (ideally) flows from the drain 315 to the source 320. When voltage source 50 applies voltage to the gate 310, the finFET 300 is turned on and current can flow.

To program the finFET device 300 (as performed for the transistor 100 above), the voltage source 50 is applied with a voltage having a magnitude equal to and/or greater than breakdown voltage of the gate oxide 330. Accordingly, the gate oxide 330 breaks down (i.e., is blown like a fuse) and the breakdown state of the gate oxide 330. The voltage source 50 may incorporate a charge pump to breakdown the gate oxide 330. Now that the gate oxide 330 is blown, the gate voltage at the gate 310 can no longer control the current flow 60 from the drain 315 to the source 320. Accordingly, assume that the drain voltage (e.g., 5 volts) is applied to the drain 315 and the gate voltage is 0 volts at the gate 310 (i.e., the voltage source 50 is turned off), the current flow continues unchanged even though no gate voltage is applied. That is, even when no gate voltage is applied (i.e., 0 volts), there is a large shift in the resistance between the programmed state (i.e., the breakdown state in which the gate oxide is blown) and the before programmed state (i.e., the gate oxide is not blown) in the finFET 300. The programmed state of the transistor 300 has a lower resistance between the source 320 and drain 315 such that electrical current 60 flows, even when no gate voltage is applied. Accordingly, the transistor 300 is programmed.

The transistor 300 can be confirmed as programmed by sweeping the gate voltage values (of the voltage source 50) while the drain voltage is on, and then measuring the ammeter 40 to recognize that there is no (appreciable) change in the current flow 60. This is because the gate voltage no longer controls the current flow 60 in FIG. 3.

The programming of transistors may apply to modern day transistors which have shorter channel lengths (L). The transistors (such as transistors 100, 300) have channel lengths L about 40 nanometers (nm) or less, which allows the transistors to be programmed as discussed herein. Having a channel length L of about 40 nm or less allows the current 60 to flow through the channel length L between the drain 15, 315 and source 20, 320; the short channel length L allows the flow of current 60 to not be controlled by the gate voltage at the gate 310 when the transistor 100, 300 is programmed (i.e., in breakdown state). In one case, the channel length L may be between 30-40 nm. In another case, the channel length may be between 20-30 nm. In one case, the channel length may be between 10-20 nm. In another case, the channel length may be between 1-10 nm. A shorter channel length in the transistors 100, 300 allows more current to flow in the programmed state (i.e., when no gate voltage is applied). For example, with a scaled (down) gate length L, the carrier transport (holes and/or electrons) between source/drain experiences less scattering either from the charge or silicon lattice, and hence the mobility is enhanced and as a result the increase of the current level. It is noted that, when the channel length L scales down to anything below 20 nm, the fin structure 380 in transistor 300 is needed to control the short channel effect.

The transistors 100, 300 may be considered three terminal fuses as the gate 10, 310, source 20, 320, and drain 15, 315 are each terminals. However, unlike traditional efuses that block current from flowing, the programmed transistors 100, 300 (when blown) allow current 60 to flow uncontrolled by the gate terminal 10, 310.

Figure 4:
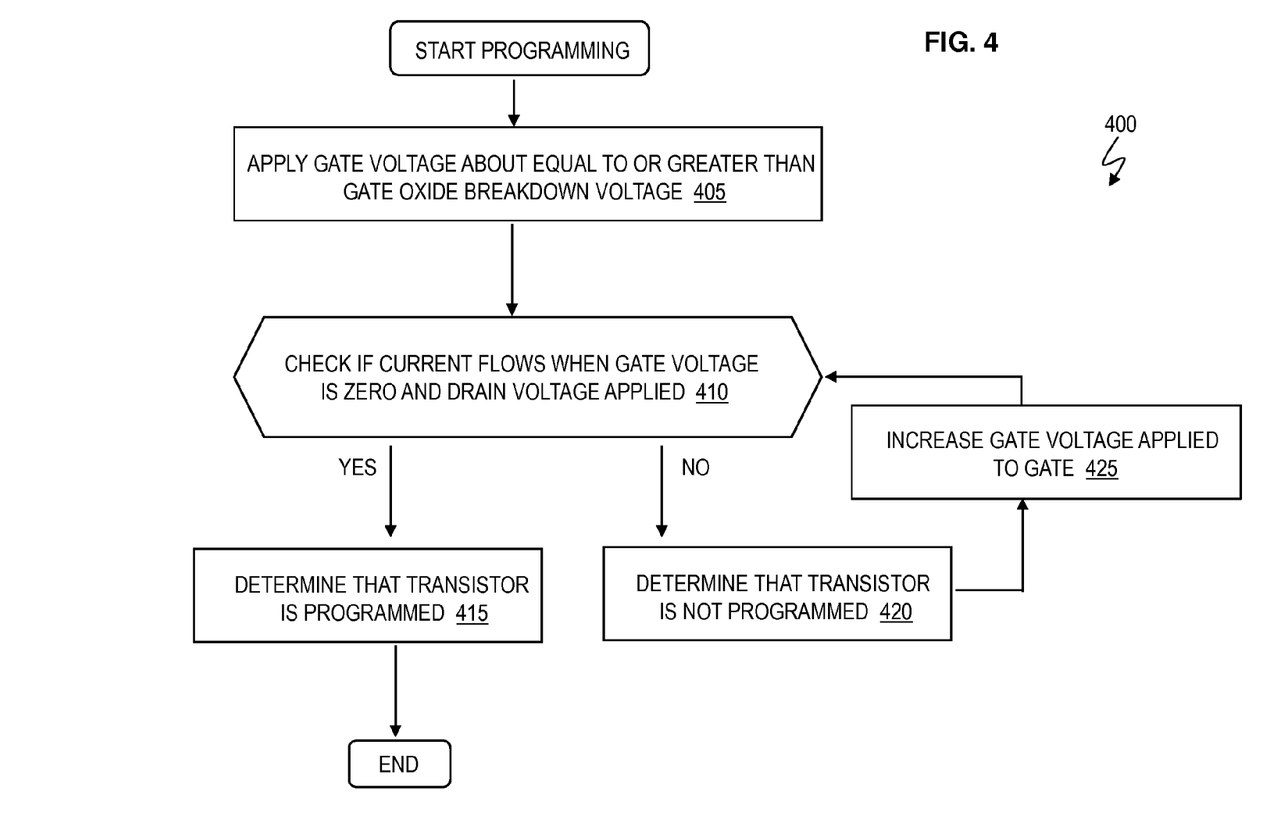
FIG. 4 illustrates a process of programming one or more transistors according to an embodiment.
Figure 5:
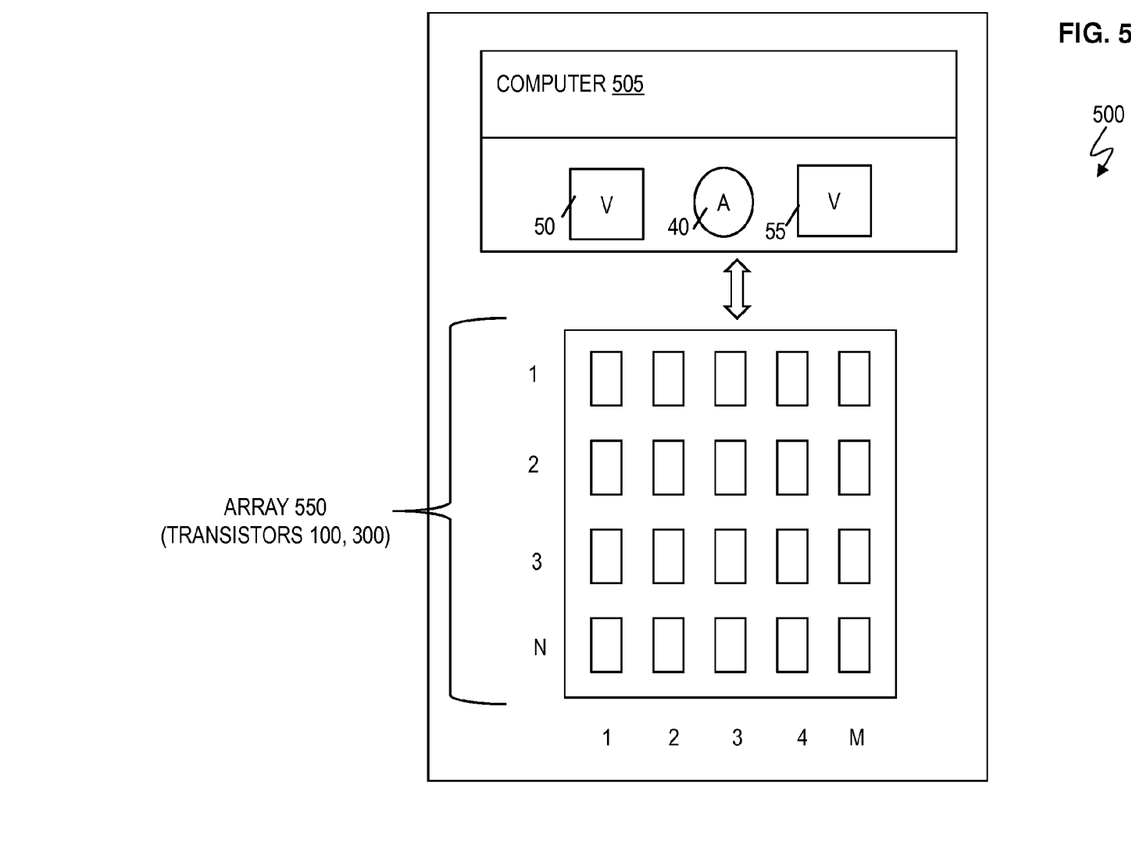
FIG. 5 illustrates a system for programming an array of individually addressable transistors according to an embodiment.

FIG. 4 illustrates a process 400 for programming one or more transistors according to an embodiment. The transistors 100, 300 may be in an array 550 as illustrated in FIG. 5, but other circuit arrangements may be utilized. Each individual transistor 100, 300 is individually addressable so as to be individually programmed as desired. Individually addressable means that the gate voltage (i.e., the voltage source 50) of each transistor 100, 300 can be controlled independently of controlling the gate voltage of another transistor 100, 300. In one implementation, the process 400 may be automatically and/or semi-automatically executed by a computer 505 having computer-executable instructions stored on a computer readable medium 720 (shown in FIG. 7). In another implementation, the process 400 may be operated by an operator. The operator may utilize the computer 505 to execute the process 400.

Referring to FIG. 4, the programming process starts for one or more transistors 100, 300, and the transistors 100, 300 may be in the array 550. At block 405, the computer 505 is configured to apply gate voltage about equal to or greater than the gate oxide breakdown voltage of the gate 10, 310 in order to blow the gate oxide 30, 330 of one or more transistors 100, 300.

At block 410, the computer 505 is configured to check if current 60 is flowing between the drain 15, 315 and source 20, 320 in the one or more transistors 100, 300 when the gate voltage is zero and when drain voltage is applied, after applying the breakdown voltage. That is, each individual transistor 100, 300 is checked respectively to determine if the transistor 100, 300 is programmed.

When the computer 505 measures that the one or more transistors 100, 300 have the current 60 flowing between the drain 15, 315 and source 20, 320, the computer 505 is configured to determine that the one or more transistors 100, 300 have been programmed, at block 415. Although the ammeter 40 is connected to the drain 15, 315, the ammeter 40 (shown with dashed lines) may be optionally connected to the source 20, 320 to measure the current 60.

However, when the computer 505 measures the one or more transistors 100, 300 and recognizes that the current 60 is not flowing between the drain 15, 315 and source 20, 320, the computer 505 is configured to determine that the one or more transistors 100, 300 have not been programmed, at block 420.

At block 425, since the gate oxide 30, 330 did not blow, the computer 505 is configured to increase the gate voltage applied to the gate 10, 310 (greater than before) and then apply the increased gate voltage to the one or more transistors 100, 300 that did not break down earlier. Block 425 proceeds to block 410 in order to check whether the increase in gate voltage caused the current 60 to flow, when the gate voltage is zero and the drain voltage is applied. Note that the computer 505 can continuously increase the gate voltage until the gate oxide 30, 330 blows for any transistors 100, 300. Also, it is noted that the computer 505 may perform the process 400 for each transistor 100, 300 that needs to be programmed, until all predefined transistors have been programmed.

Now turning to FIG. 5 in more detail, a system 500 is provided for programming the array 550 of individually addressable transistors 100, 300 according to an embodiment. The transistors in the array 550 may be the transistors 100, transistor 300, and/or a combination of both. The array 550 may have transistors 100, 300 in 1-N rows and 1-M columns. Since each transistor 100, 300 is individually addressable, this means that the computer 505 can program any one or more transistors 100, 300 in the array 550, and the transistors 100, 300 can be simultaneously and/or consecutively programmed. The computer 505 may be configured to program some transistors 100, 300 in the array 550 and not program others. The computer 505 may be configured to program transistors 100, 300 in certain rows in the array 550 and not program transistors in other rows. The computer 505 may be configured to program transistors 100, 300 in certain columns in the array 550 and not program others. The computer 505 may be configured to program any number of transistors 100, 300 in any rows and columns. The option of which transistors are programmed and which transistors are not programmed can be determined by an operator and/or computer 505 (predefined computer executable-instructions). The transistors 100, 300 are one time programmable and cannot be returned back to an unprogrammed state. The unprogrammed state or unprogrammed transistor does not have its gate oxide blown, therefore functioning as a normal transistor.

In order to program the transistors 100, 300, the computer 505 may include, be coupled to, and control one or more voltage sources 50, voltages sources 55, and/or ammeters 40. Although the computer 505 has been discussed for explanation purposes, embodiments are not limited to a computer. In one implementation, a machine may be utilized which has capabilities to individually connect to transistors, blow the gate oxide, and confirm that the transistor is programmed as discussed herein.

Although the array 550 can be utilized, the transistors 100, 300 are not limited to being programmed in an array. The transistors 100, 300 can be programmed in any circuit configuration/arrangement in which the gate voltage applied to the gate 10, 310 is controlled to break down the gate oxide 30, 330 as discussed herein.

Figure 6:
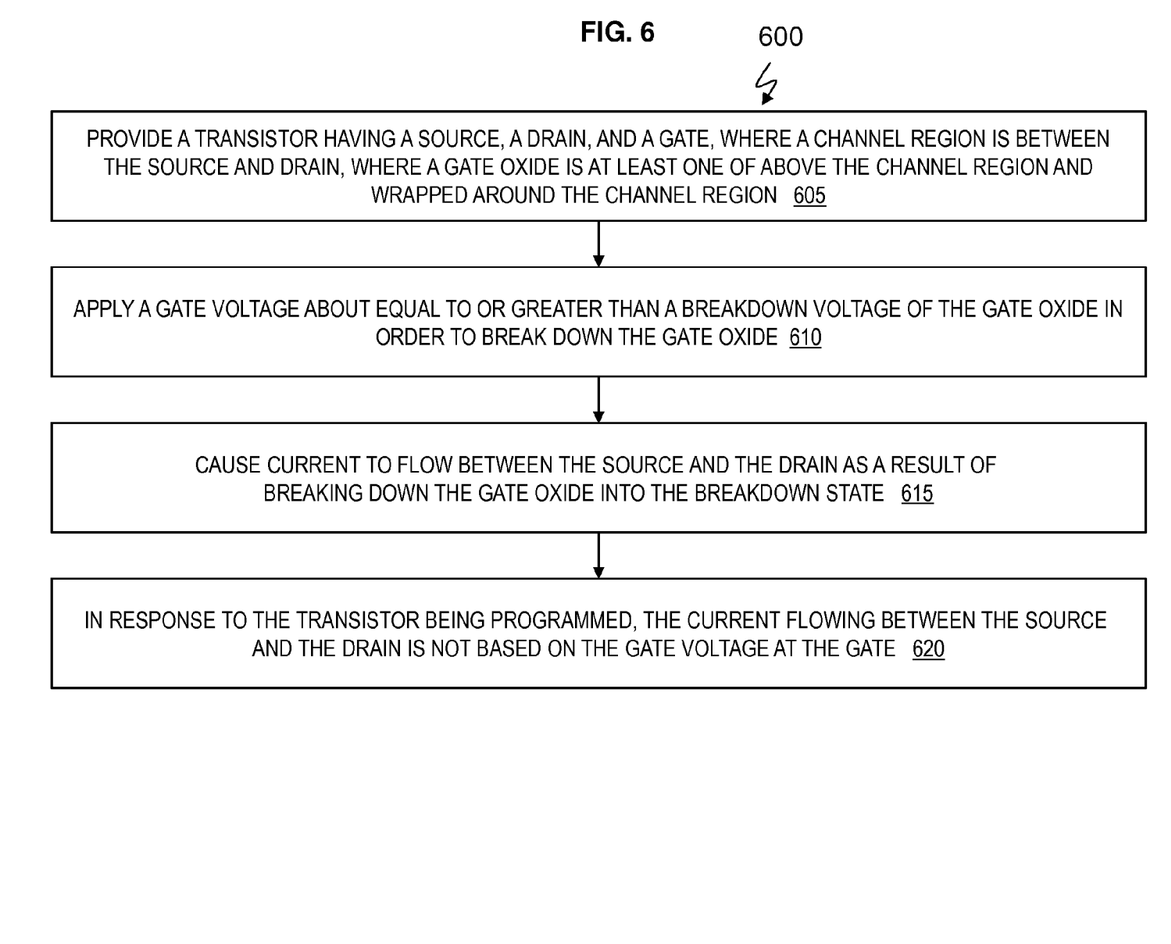
FIG. 6 illustrates a method of programming transistors according to an embodiment.

FIG. 6 illustrates a method 600 for programming one or more transistors (such as the transistors 100 and/or 300) according to an embodiment. At block 605, the transistor 100, 300 having a source 20, 320, a drain 15, 315, and a gate 10, 310 is provided in which a channel region connects the source and drain and a gate oxide 30, 330 is at least one of above the channel region and wrapped around the channel region.

The transistor 100, 300 is programmed by applying a gate voltage about equal to or greater than a breakdown voltage of the gate oxide 30, 330 in order to break down the gate oxide 30, 330 at block 610, and causing current to flow between the source 20, 320 and the drain 15, 315 as a result of breaking down the gate oxide into the breakdown state at block 615.

At block 620, in response to the transistor being programmed, the current 60 flowing between the source and the drain is not based on (or controlled by) the gate voltage at the gate 10, 310.

A distance between the source and the drain is a channel length L, which corresponds to the length of the channel region. Accordingly, the channel region (or channel) has a length L. The channel length L is (about) less than 40 nanometers in order for the transistor 100, 300 to be programmed. In one case, the channel length is (about) less than 30 nanometers in order for the transistor to be programmed. In another case, the channel length is about less than 20 nanometers in order for the transistor to be programmed.

Before programming the transistor, nearly no amount of the current flows between the source and the drain when no gate voltage is applied. Leakage current is not the current 60 that results after the transistor 100, 300 has been programmed. After programming the transistor and when no gate voltage is applied, the current 60 flowing between the source and the drain is at least one 1 order of magnitude higher (or more) than the leakage current flowing before programming the transistor. Although no gate voltage is applied, it is understood that drain voltage is applied to the drain 15, 315 (as discussed herein).

When no gate voltage is applied, a leakage current flows between the source and the drain prior to programming the transistor. When no gate voltage is applied, the current flowing between the source and the drain is at least 1 order of magnitude higher than the leakage current.

Drain voltage applied to the drain remains constant, and in response to programming the transistor, the gate voltage can no longer control the current 60 flow.

In one case, a charge pump (implemented as the voltage source 50 to the gate) applies the gate voltage equal to and/or greater than the breakdown voltage of the gate oxide in order to program the transistor. The transistor is a finFET device.

After applying the gate voltage to program the transistor (i.e., blow the gate oxide), the transistor (that is programmed) is checked by measuring the current flowing between the source and the drain when no gate voltage is applied in order to confirm that the current is greater than a leakage current. When not confirmed as programmed, the gate voltage applied to break down the gate oxide is increased in response to the current not being greater than the leakage current, and the increased gate voltage is applied to break down the gate oxide. The transistor is again checked to confirm whether the transistor is programmed.

Referring back to FIG. 5, a method may include programming a plurality of transistors 100, 300. The plurality of transistors may be configured into a circuit arrangement (such as the array 550), and each of the plurality of transistors has a source 20, 320, a drain 15, 315, and a gate 10, 310. A channel region (with channel length L) is between the source and the drain, and the gate oxide 30, 330 is at least one of above the channel region (FIGS. 1 and 2) and/or wrapped around (FIG. 3) the channel region. The certain ones of the plurality of transistors are programmed by: applying a gate voltage about equal to and/or greater than a breakdown voltage of the gate oxide in order to break down the gate oxide, and causing current 60 to flow between the source and the drain as a result of breaking down the gate oxide into a breakdown state. In response to the certain ones of the plurality of transistors being programmed, the current flowing between the source and the drain of the certain ones of the plurality of transistors is not based on the gate voltage at the gate 10, 310. In one case, the certain ones of the plurality of transistors can be transistors 100, 300 in particular rows and columns in the array 550 but not in other rows and columns.

Figure 7:
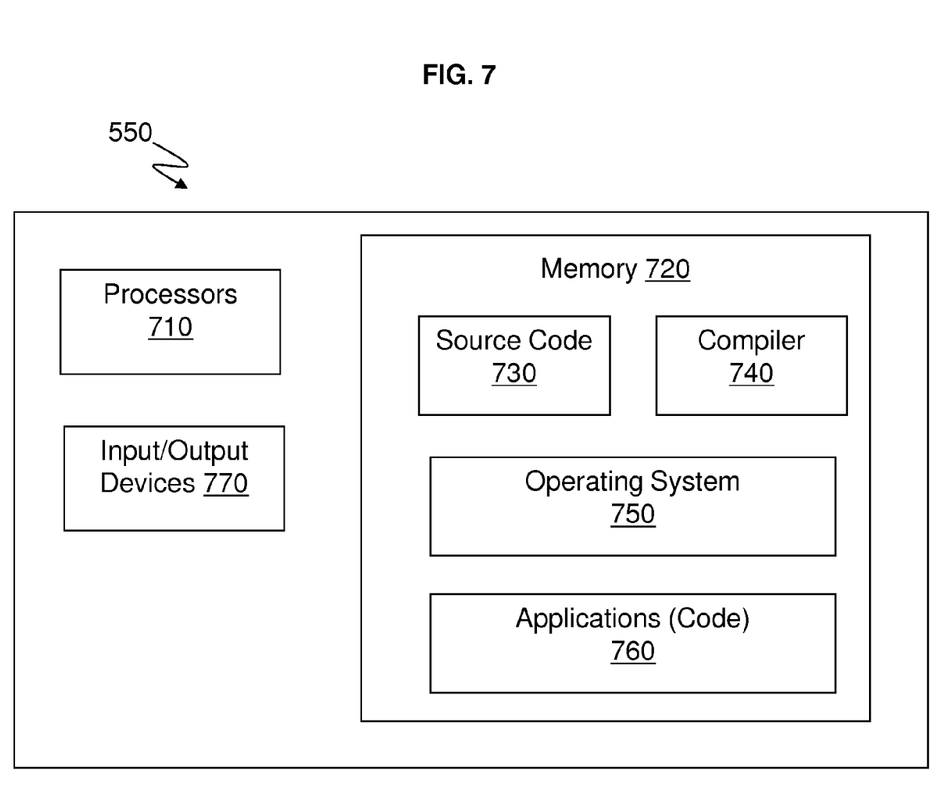
FIG. 7 illustrates an example of a computer having capabilities to program transistors as discussed herein, which may be included and utilized in embodiments.

FIG. 7 illustrates an example of a computer 700 having capabilities, which may be included in exemplary embodiments. Various methods, procedures, modules, flow diagrams, tools, applications, circuits, elements, and techniques discussed herein may also incorporate and/or utilize the capabilities of the computer 700. Moreover, capabilities of the computer 700 may be utilized to implement features of exemplary embodiments discussed herein. One or more of the capabilities of the computer 700 may be utilized to implement, incorporate, to connect to, and/or to support any element discussed herein (as understood by one skilled in the art) in FIGS. 1-6.

Generally, in terms of hardware architecture, the computer 700 may include one or more processors 710, computer readable storage memory 720, and one or more input and/or output (I/O) devices 770 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 710 is a hardware device for executing software that can be stored in the memory 720. The processor 710 can be virtually any custom made or commercially available processor, a central processing unit (CPU), a data signal processor (DSP), or an auxiliary processor among several processors associated with the computer 700, and the processor 710 may be a semiconductor based microprocessor (in the form of a microchip) or a microprocessor. Note that the memory 720 can have a distributed architecture, where various components are situated remote from one another, but can be accessed by the processor 710.

The software in the computer readable memory 720 may include one or more separate programs, each of which comprises an ordered listing of executable instructions for implementing logical functions. The software in the memory 720 includes a suitable operating system (O/S) 750 and one or more applications 760 of the exemplary embodiments. As illustrated, the application 760 comprises numerous functional components for implementing the features, processes, methods, functions, and operations of the exemplary embodiments. The application 760 of the computer 700 may represent numerous applications, agents, software components, modules, interfaces, controllers, etc., as discussed herein but the application 760 is not meant to be a limitation.

The operating system 750 may control the execution of other computer programs, and provides scheduling, input-output control, file and data management, memory management, and communication control and related services.

The application 760 may be a source program, executable program (object code), script, or any other entity comprising a set of instructions to be performed. When a source program, then the program is usually translated via a compiler, assembler, interpreter, or the like, which may or may not be included within the memory 720, so as to operate properly in connection with the O/S 750. Furthermore, the application 760 can be written as (a) an object oriented programming language, which has classes of data and methods, or (b) a procedure programming language, which has routines, subroutines, and/or functions.

The I/O devices 770 may include input devices (or peripherals) such as, for example but not limited to, a mouse, keyboard, scanner, microphone, camera, etc. Furthermore, the I/O devices 770 may also include output devices (or peripherals), for example but not limited to, a printer, display, etc. Finally, the I/O devices 770 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 770 also include components for communicating over various networks, such as the Internet or an intranet. The I/O devices 770 may be connected to and/or communicate with the processor 710 utilizing Bluetooth connections and cables (via, e.g., Universal Serial Bus (USB) ports, serial ports, parallel ports, FireWire, HDMI (High-Definition Multimedia Interface), PCIe, InfiniBand®, or proprietary interfaces, etc.).

When the computer 700 is in operation, the processor 710 is configured to execute software stored within the memory 720, to communicate data to and from the memory 720, and to generally control operations of the computer 700 pursuant to the software. The application 760 and the O/S 750 are read, in whole or in part, by the processor 710, perhaps buffered within the processor 710, and then executed.

When the application 760 is implemented in software it should be noted that the application 760 can be stored on virtually any computer readable storage medium for use by or in connection with any computer related system or method.

The application 760 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 760 is implemented in hardware, the application 760 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

It will be understood that those skilled in the art, both now and in the future, may make various improvements and enhancements which fall within the scope of the claims which follow.

What is claimed is:

1. A programmed circuit comprising:
   a plurality of transistors in an arrangement, each of the plurality of transistors having a source, a drain, and a gate, wherein a channel region is between the source and the drain, wherein a gate dielectric is at least one of above the channel region and wrapped around the channel region;
   a programmed set of the plurality of transistors having been programmed, wherein the programmed set of the plurality of transistors has the gate dielectric that is broken down in response to applying a gate voltage about equal to or greater than a breakdown voltage of the gate dielectric; and
   an unprogrammed set of the plurality of transistors not having been programmed, wherein the unprogrammed set of the plurality of transistors have the gate dielectric that has not been broken down.

* * * * *